US010741785B2

(12) United States Patent
Yoo et al.

(10) Patent No.: US 10,741,785 B2
(45) Date of Patent: Aug. 11, 2020

(54) REFLECTIVE ELECTRODE, METHOD OF MANUFACTURING REFLECTIVE ELECTRODE, AND ORGANIC LIGHT EMITTING DIODE DISPLAY INCLUDING REFLECTIVE ELECTRODE

(71) Applicant: LG DISPLAY CO., LTD., Seoul (KR)

(72) Inventors: Donghee Yoo, Paju-si (KR); Kyunghoon Lee, Paju-si (KR); Taehan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/140,842

(22) Filed: Sep. 25, 2018

(65) Prior Publication Data
US 2019/0103581 A1 Apr. 4, 2019

(30) Foreign Application Priority Data

Sep. 29, 2017 (KR) .................. 10-2017-0128232

(51) Int. Cl.
*H01L 35/24* (2006.01)
*H01L 51/00* (2006.01)
(Continued)

(52) U.S. Cl.
CPC ...... *H01L 51/5218* (2013.01); *H01L 27/3211* (2013.01); *H01L 51/5215* (2013.01);
(Continued)

(58) Field of Classification Search
CPC ................. H01L 51/5218; H01L 51/56; H01L 51/5215; H01L 27/3211; H01L 51/5221; H01L 51/5268
See application file for complete search history.

(56) References Cited

U.S. PATENT DOCUMENTS

| 7,723,134 | B2 * | 5/2010 | Jo ........................ H01L 27/3276 257/E27.123 |
| 7,872,414 | B2 * | 1/2011 | Sugita ..................... B82Y 20/00 313/506 |

(Continued)

FOREIGN PATENT DOCUMENTS

| JP | 2015090810 A | 5/2015 |
| KR | 20090076792 A | 7/2009 |

(Continued)

OTHER PUBLICATIONS

Office Action dated Sep. 17, 2018 issued in the corresponding Korean Patent Application No. 10-2017-0128232, pp. 1-5.

*Primary Examiner* — Ismail A Muse
(74) *Attorney, Agent, or Firm* — Polsinelli PC

(57) ABSTRACT

A reflective electrode, a method of manufacturing the reflective electrode, and an organic light emitting diode display including the reflective electrode are disclosed. The reflective electrode includes a first transparent conductive layer formed of a transparent conductive material, a reflective layer disposed on the first transparent conductive layer and including a plurality of grains formed of a reflective material, and a second transparent conductive layer disposed on the reflective layer and formed of a transparent conductive material. The adjacent grains are spaced from each other.

13 Claims, 8 Drawing Sheets

(51) Int. Cl.
  *H01L 29/08* (2006.01)
  *H01L 51/52* (2006.01)
  *H01L 51/56* (2006.01)
  *H01L 27/32* (2006.01)

(52) U.S. Cl.
  CPC ......... *H01L 51/5221* (2013.01); *H01L 51/56* (2013.01); *H01L 51/5268* (2013.01)

(56) References Cited

U.S. PATENT DOCUMENTS

| | | | | |
|---|---|---|---|---|
| 2005/0186359 A1* | 8/2005 | Ishizuka | ........... | C23F 1/02 428/1.1 |
| 2005/0218817 A1* | 10/2005 | Kaneko | ........... | G02F 1/134363 315/167 |
| 2007/0126958 A1* | 6/2007 | Kim | ........... | G02F 1/133555 349/114 |
| 2008/0138921 A1* | 6/2008 | Nakahori | ........... | G02F 1/133555 438/30 |
| 2009/0101911 A1* | 4/2009 | Kim | ........... | H01L 29/4908 257/66 |
| 2009/0165845 A1* | 7/2009 | Tsao | ........... | H01L 31/022425 136/256 |
| 2010/0006842 A1* | 1/2010 | Fujita | ........... | G02F 1/133555 257/59 |
| 2011/0315970 A1* | 12/2011 | Yokoyama | ........... | H01L 27/3211 257/40 |
| 2012/0152347 A1* | 6/2012 | Lee | ........... | H01L 51/442 136/256 |
| 2013/0056785 A1* | 3/2013 | Hwang | ........... | H01L 27/15 257/99 |
| 2014/0151651 A1* | 6/2014 | Jin | ........... | H01L 51/5209 257/40 |
| 2014/0191266 A1* | 7/2014 | Lee | ........... | H01L 51/442 257/98 |
| 2015/0270327 A1* | 9/2015 | Oh | ........... | H01L 51/5209 257/40 |
| 2017/0003547 A1* | 1/2017 | Tochigi | ........... | G02F 1/133606 |
| 2017/0018741 A1* | 1/2017 | Osawa | ........... | H01L 51/5268 |
| 2017/0160592 A1* | 6/2017 | Okuyama | ........... | G02F 1/133553 |
| 2017/0330917 A1* | 11/2017 | Kim | ........... | G06F 3/0412 |
| 2018/0145119 A1* | 5/2018 | Choi | ........... | H01L 27/322 |
| 2018/0175320 A1* | 6/2018 | Lee | ........... | H01L 51/5265 |
| 2019/0097166 A1* | 3/2019 | Gong | ........... | H01L 51/5271 |
| 2019/0148663 A1* | 5/2019 | Lee | ........... | H01L 51/5048 |
| 2019/0331955 A1* | 10/2019 | Lee | ........... | G02F 1/133617 |

FOREIGN PATENT DOCUMENTS

| KR | 20160035680 A | 4/2016 |
|---|---|---|
| KR | 20160090348 A | 7/2016 |

\* cited by examiner

REFLECTIVE ELECTRODE, METHOD OF MANUFACTURING REFLECTIVE ELECTRODE, AND ORGANIC LIGHT EMITTING DIODE DISPLAY INCLUDING REFLECTIVE ELECTRODE

CROSS REFERENCE TO RELATED APPLICATION

This application claims the priority benefit of Korean Patent Application No. 10-2017-0128232 filed on Sep. 29, 2017, which is incorporated herein by reference for all purposes as if fully set forth herein.

BACKGROUND OF THE DISCLOSURE

Field of the Disclosure

The present disclosure relates to a reflective electrode, a method of manufacturing the reflective electrode, and an organic light emitting diode display including the reflective electrode.

Description of the Background

Various display devices have replaced heavy and bulky cathode ray tubes (CRTs). Examples of the display devices include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

The OLED display includes organic light emitting diodes (OLEDs) converting electric energy into light energy. The OLED includes an anode, a cathode, and an organic emission layer between the anode and the cathode. The OLED display is configured such that the OLED emits light while excitons formed by combining holes from the anode and electrons from the cathode inside an emission layer fall from an excited state to a ground state, and thus displays an image.

Efforts have been recently made to improve emission efficiency of the OLEDs in an optical design of the OLEDs. For example, a method for increasing emission efficiency of OLEDs was proposed by controlling an optical interference distance, such as properly matching refractive indexes of organic materials forming an organic emission layer or adjusting thicknesses of organic layers. However, there was a difficulty in improving the emission efficiency of the OLEDs using an outcoupling technology because of limitation of the material itself.

SUMMARY

The present disclosure provides a reflective electrode capable of improving outcoupling efficiency, a method of manufacturing the reflective electrode, and an organic light emitting diode (OLED) display including the reflective electrode.

In one aspect, there is provided a reflective electrode comprising a first transparent conductive layer formed of a transparent conductive material, a reflective layer disposed on the first transparent conductive layer, the reflective layer including a plurality of grains formed of a reflective material, and a second transparent conductive layer disposed on the reflective layer and formed of a transparent conductive material.

The adjacent grains are spaced from each other. A distance between the adjacent grains is set within a range of 150 Å to 600 Å. A height of the grain is set within a range of 50 Å to 200 Å.

In another aspect, there is provided an organic light emitting diode display comprising a display panel including a plurality of pixels, each pixel including a transistor and an organic light emitting diode connected to the transistor, wherein the organic light emitting diode includes a reflective electrode, wherein the reflective electrode includes a first transparent conductive layer formed of a transparent conductive material, a reflective layer disposed on the first transparent conductive layer, the reflective layer including a plurality of grains formed of a reflective material, and a second transparent conductive layer disposed on the reflective layer and formed of a transparent conductive material.

The plurality of pixels includes first and second pixels each emitting light of a different color. A range of a distance between grains of a reflective electrode included in the first pixel is set to be different from a range of a distance between grains of a reflective electrode included in the second pixel.

The plurality of pixels includes a first pixel emitting red light, a second pixel emitting green light, and a third pixel emitting blue light. A distance between grains of a reflective electrode included in the first pixel has an average value within a range of 380 Å to 450 Å. A distance between grains of a reflective electrode included in the second pixel has an average value within a range of 280 Å to 380 Å. A distance between grains of a reflective electrode included in the third pixel has an average value within a range of 230 Å to 280 Å.

In yet another aspect, there is provided a method of manufacturing a reflective electrode comprising forming a first transparent conductive layer formed of a transparent conductive material, applying a reflective conductive material to the first transparent conductive layer and thermally processing the reflective conductive material to form a reflective layer including a plurality of grains, and forming a second transparent conductive layer formed of a transparent conductive material on the reflective layer.

BRIEF DESCRIPTION OF THE DRAWINGS

The accompanying drawings, that may be included to provide a further understanding of the disclosure and are incorporated in and constitute a part of this application, illustrate aspects of the disclosure and together with the description serve to explain various principles of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. Detailed descriptions of known arts will be omitted if such may mislead the aspects of the disclosure. In describing various aspects, the same components may be described in a first aspect, and a description thereof may be omitted in other aspects.

The terms "first", "second", etc. may be used to describe various components, but the components are not limited by such terms. The terms are used only for the purpose of distinguishing one component from other components.

Figure 1:
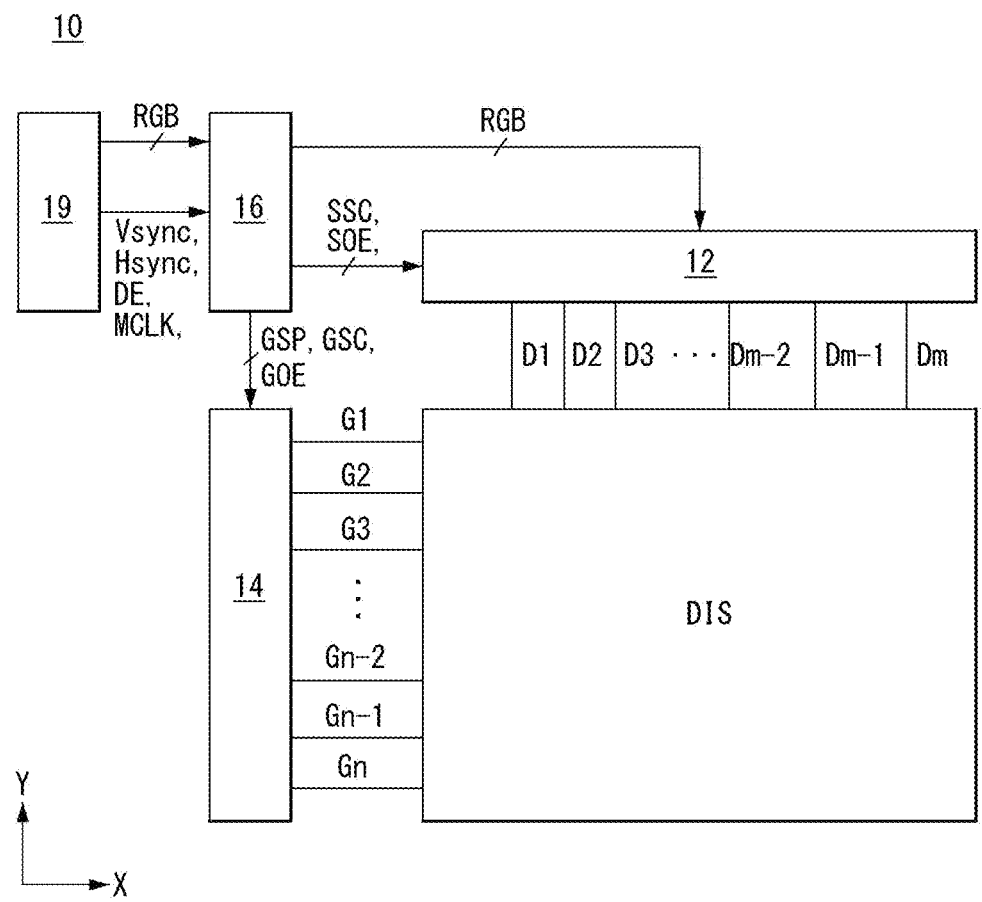
FIG. 1 is a block diagram schematically illustrating an organic light emitting diode (OLED) display according to an aspect of the disclosure.
Figure 2:
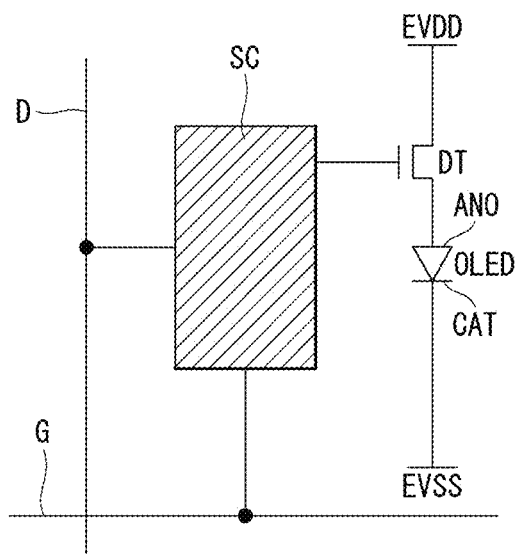
FIG. 2 schematically illustrates configuration of a pixel shown in FIG. 1.
Figure 3A:
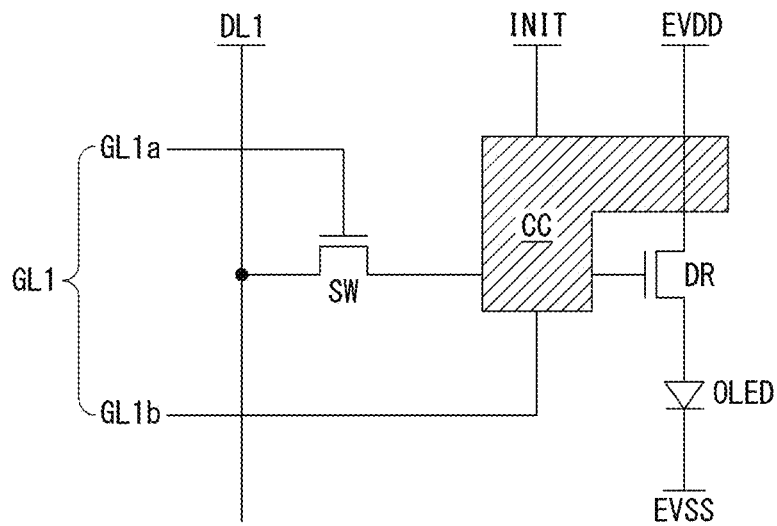
FIGS. 3A and 3B illustrate in detail examples of a configuration of a pixel shown in FIG. 2.
Figure 3B:
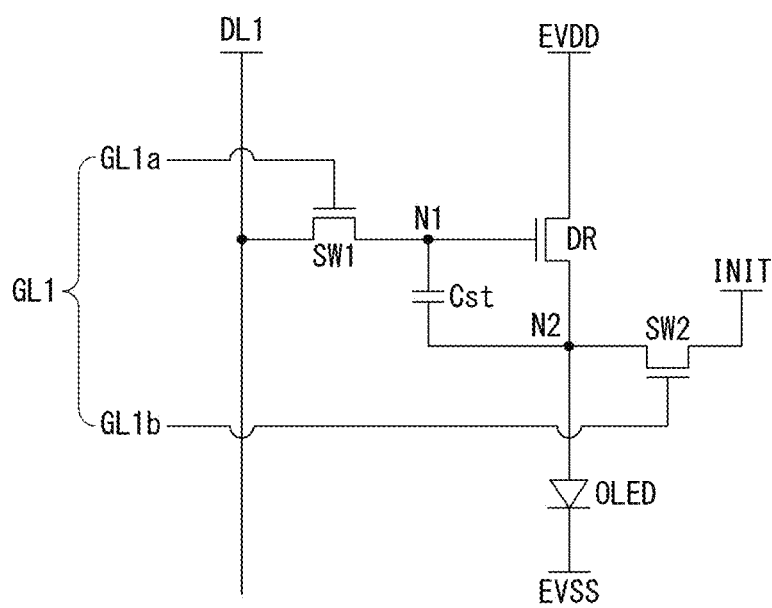
Figure 4:
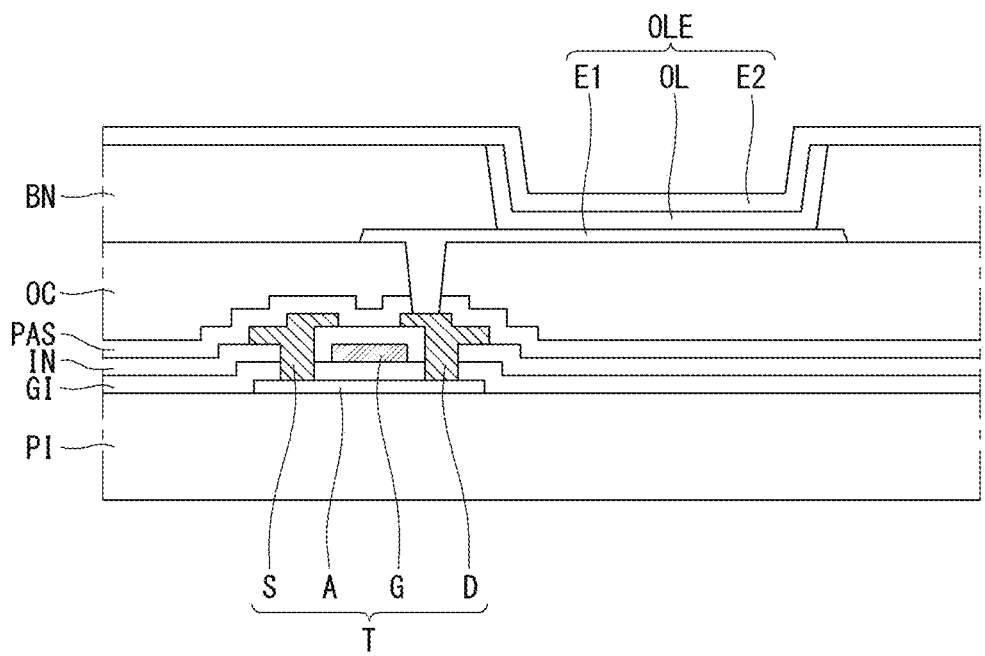
FIG. 4 is a cross-sectional view illustrating a pixel of an OLED display according to an aspect of the disclosure.
Figure 5:
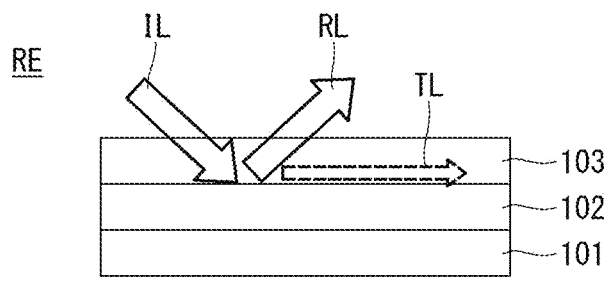
FIG. 5 illustrates a configuration of light reflected from a reflective electrode of the related art.
Figure 6A:
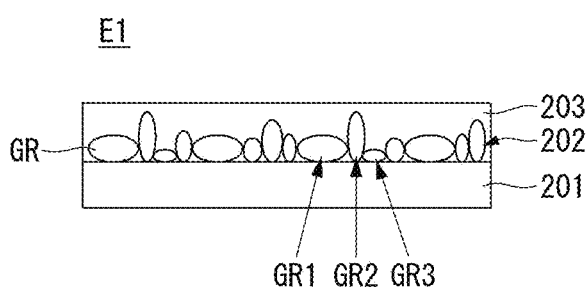
FIGS. 6A to 6C illustrate configurations of a reflective electrode according to an aspect of the disclosure.
Figure 6B:
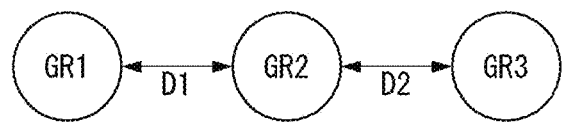
Figure 6C:
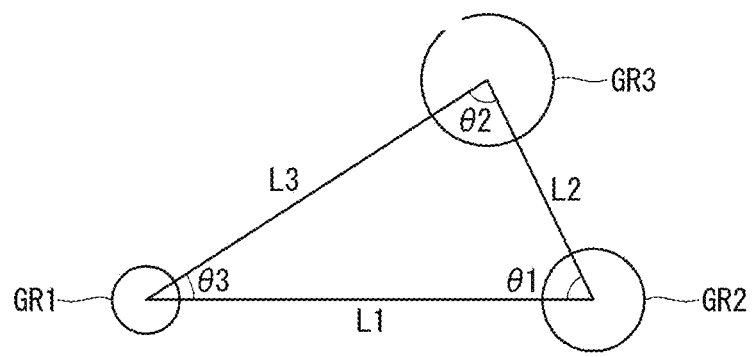
Figure 7A:
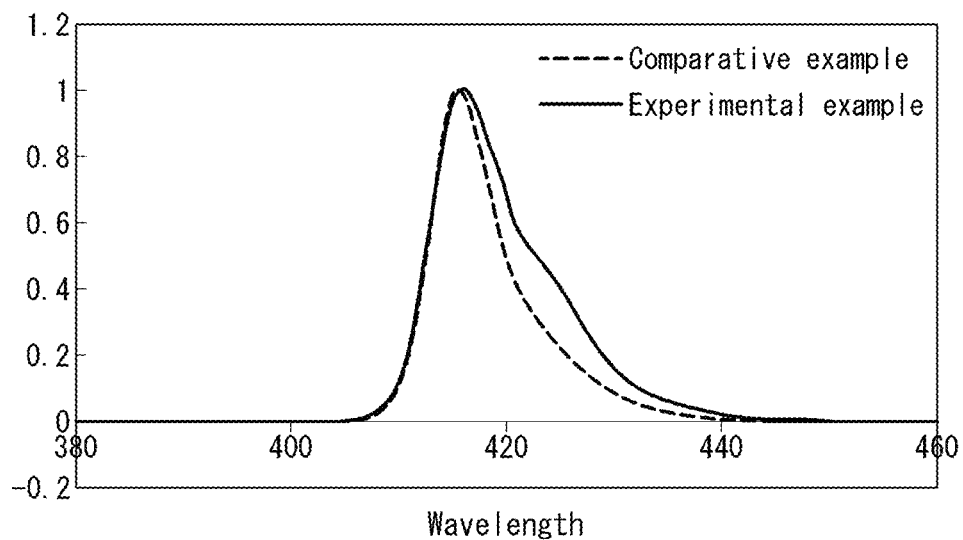
FIGS. 7A and 7B illustrate experimental data for explaining an effect according to an aspect of the disclosure.
Figure 7B:
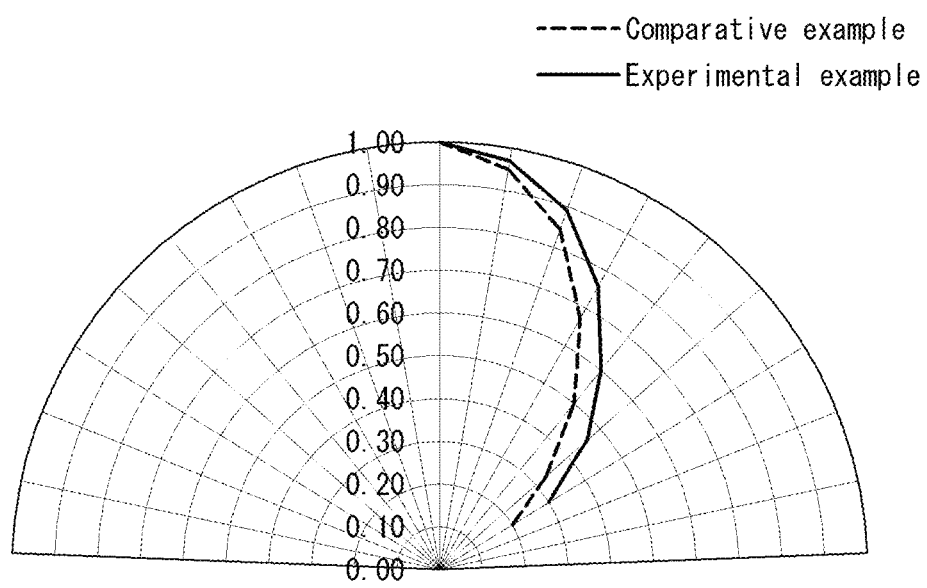

FIG. 1 is a block diagram schematically illustrating an organic light emitting diode (OLED) display according to an aspect of the disclosure. FIG. 2 schematically illustrates configuration of a pixel shown in FIG. 1. FIGS. 3A and 3B illustrate in detail examples of a configuration of a pixel shown in FIG. 2. FIG. 4 is a cross-sectional view illustrating a pixel of an OLED display according to an aspect of the disclosure. FIG. 5 illustrates a configuration of light reflected from a reflective electrode of the related art. FIGS. 6A to 6C illustrate configurations of a reflective electrode according to an aspect of the disclosure. FIGS. 7A and 7B illustrate experimental data for explaining an effect according to an aspect of the disclosure.

Referring to FIG. 1, an OLED display 10 according to an aspect of the disclosure includes a display driving circuit and a display panel DIS.

The display driving circuit includes a data driving circuit 12, a gate driving circuit 14, and a timing controller 16. The display driving circuit applies a video data voltage of an input image to pixels PXL of the display panel DIS. The data driving circuit 12 converts digital video data RGB received from the timing controller 16 into an analog gamma compensation voltage and generates a data voltage. The data voltage output from the data driving circuit 12 is supplied to data lines D1 to Dm, where m is a positive integer. The gate driving circuit 14 sequentially supplies a gate signal synchronized with the data voltage to gate lines G1 to Gn and selects pixels PXL of the display panel DIS to which the data voltage is applied, where n is a positive integer.

The timing controller 16 receives timing signals, such as a vertical sync signal Vsync, a horizontal sync signal Hsync, a data enable signal DE, and a main clock MCLK, from a host system 19 and synchronizes operation timing of the data driving circuit 12 and operation timing of the gate driving circuit 14 with each other. A data timing control signal for controlling the data driving circuit 12 includes a source sampling clock SSC, a source output enable signal SOE, and the like. A gate timing control signal for controlling the gate driving circuit 14 includes a gate start pulse GSP, a gate shift clock GSC, a gate output enable signal GOE, and the like.

The host system 19 may be one of a television system, a set-top box, a navigation system, a DVD player, a Blu-ray player, a personal computer (PC), a home theater system, a phone system, and other systems that include or operate in conjunction with a display. The host system 19 includes a system-on chip (SoC), in which a scaler is embedded, and converts the digital video data RGB of the input image into a format suitable for displaying the input image on the display panel DIS. The host system 19 transmits the digital video data RGB of the input image and the timing signals Vsync, Hsync, DE and MCLK to the timing controller 16.

The display panel DIS may have various planar shapes. Namely, the display panel DIS may have various freeform planar shapes including a circle, an oval, a polygon, etc. as well as a planar shape of a rectangle and a square.

The display panel DIS includes a pixel array. The pixel array includes the plurality of pixels PXL. The pixels PXL may be defined by an intersection structure of the data lines D1 to Dm and the gate lines G1 to Gn. However, aspects are not limited thereto. Each pixel PXL includes an organic light emitting diode serving as a self-emission element. The display panel DIS includes red, green, and blue pixels PXL emitting red, green, and blue light.

The pixels PXL may have various shapes. Namely, the pixels PXL may have various planar shapes including a circle, an oval, a polygon, etc. One pixel of the pixels PXL may have a different size and/or a different planar shape from another pixel.

Referring to FIG. 2, the display panel DIS includes a plurality of data lines D, a plurality of gate lines G intersecting the data lines D, and pixels PXL respectively arranged at intersections of the data lines D and the gate lines G in a matrix. Each pixel PXL includes an organic light emitting diode OLED, a driving thin film transistor (TFT) DT for controlling an amount of current flowing through the organic light emitting diode OLED, and a programming unit SC for setting a gate-to-source voltage of the driving TFT DT.

The programming unit SC may include at least one switching TFT and at least one storage capacitor. The switching TFT is turned on in response to a gate signal from the gate line G to thereby apply a data voltage from the data line D to one electrode of the storage capacitor. The driving TFT DT controls an amount of current supplied to the organic light emitting diode OLED depending on a magnitude of voltage stored in the storage capacitor, thereby adjusting an amount of light emitted by the organic light emitting diode OLED. The amount of light emitted by the organic light emitting diode OLED is proportional to the amount of current supplied from the driving TFT DT. The pixel is connected to a high potential voltage source EVDD and a low potential voltage source EVSS and receives a high potential power voltage and a low potential power voltage from a power generator (not shown). The TFTs constituting the pixel PXL may be p-type TFTs or n-type TFTs. Further, semiconductor layers of the TFTs constituting the pixel PXL may include amorphous silicon, polycrystalline silicon, or oxide. In the following description, aspects of the disclosure use a semiconductor layer including oxide as an example. The organic light emitting diode OLED includes an anode ANO, a cathode CAT, and an organic emission layer between the anode ANO and the cathode CAT. The anode ANO is connected to the driving TFT DT.

As shown in FIG. 3A, a subpixel may include an internal compensation circuit CC in addition to a switching transistor SW, a driving transistor DR, a capacitor Cst, and an organic light emitting diode OLED that are described above. The internal compensation circuit CC may include one or more transistors connected to a compensation signal line INIT. The internal compensation circuit CC sets a gate-to-source voltage of the driving transistor DR to a voltage to which a threshold voltage of the driving transistor DR is reflected, thereby excluding changes in a luminance resulting from the threshold voltage of the driving transistor DR when the organic light emitting diode OLED emits light. In this instance, a scan line GL1 includes at least two scan lines GL1a and GL1b for controlling the switching transistor SW and the transistors of the internal compensation circuit CC.

As shown in FIG. 3B, a subpixel may include a switching transistor SW1, a driving transistor DR, a sensing transistor SW2, a capacitor Cst, and an organic light emitting diode OLED. The sensing transistor SW2 is a transistor that may be included in the internal compensation circuit CC, and performs a sensing operation for a compensation drive of the subpixel.

The switching transistor SW1 functions to supply a data voltage supplied through a data line DL1 to a first node N1 in response to a scan signal supplied through the first scan line GL1a. The sensing transistor SW2 functions to initialize or sense a second node N2 between the driving transistor DR and the organic light emitting diode OLED in response to a sensing signal supplied through the second scan line GL1b.

Aspects of the disclosure are not limited to the above-described structure of the pixel. For example, aspects of the disclosure may use various structures including 2T(Transistor)1C(Capacitor), 3T1C, 4T2C, 5T2C, 6T2C, 7T2C, etc.

Referring to FIG. 4, an OLED display according to an aspect of the disclosure includes a substrate SUB including a thin film transistor T and an organic light emitting diode OLE. The substrate SUB may be made of glass material, plastic material or silicon material. Although not shown, an encapsulation layer covering the thin film transistor T and the organic light emitting diode OLE may be further provided on the substrate SUS. The encapsulation layer can protect the internal components from moisture and oxygen which may penetrate from the outside.

The substrate SUB may be made of glass material or plastic material. For example, the substrate SUB may be made of plastic material such as polyimide (PI), polyethylene terephthalate (PET), polyethylene naphthalate (PEN), and polycarbonate (PC) and may have flexible characteristics.

The thin film transistor T and the organic light emitting diode OLE connected to the thin film transistor T are formed on the substrate SUS. A light shielding layer (not shown) and a buffer layer (not shown) may be formed between the substrate SUS and the thin film transistor T. The light shielding layer is disposed to overlap a semiconductor layer, particularly, a channel of the thin film transistor T and can protect a semiconductor element from external light. The buffer layer can block ions or impurities diffused from the substrate SUS and also block moisture penetrating from the outside.

The thin film transistor T includes a semiconductor layer A, a gate electrode G, a source electrode S, and a drain electrode D. A gate insulating layer GI and the gate electrode G are disposed on the semiconductor layer A. The gate insulating layer GI may function to insulate the gate electrode G and may be formed of silicon oxide (SiOx) or silicon nitride (SiNx). However, aspects are not limited thereto. The gate insulating layer GI may be formed to cover the entire surface of the substrate SUS. Although not shown, the gate insulating layer GI and the gate electrode G may be patterned using the same mask. In this instance, the gate insulating layer GI and the gate electrode G may have the same planar shape.

The gate electrode G is disposed to overlap the semiconductor layer A with the gate insulating layer GI interposed therebetween. The gate electrode G may be formed as a single layer or a multilayer using copper (Cu), molybdenum (Mo), aluminum (Al), chrome (Cr), gold (Au), titanium (Ti), nickel (Ni), neodymium (Nd), tantalum (Ta), tungsten (W), or a combination thereof.

An interlayer dielectric layer IN is positioned on the gate electrode G. The interlayer dielectric layer IN may function to insulate the gate electrode G and the source and drain electrodes S and D from each other. The interlayer dielectric layer IN may be formed of silicon oxide (SiOx), silicon nitride (SiNx), or a multilayer thereof. However, aspects are not limited thereto.

The source electrode S and the drain electrode D are positioned on the interlayer dielectric layer IN. The source electrode S and the drain electrode D are spaced from each other by a predetermined distance. The source electrode S contacts one side of the semiconductor layer A through a source contact hole penetrating the interlayer dielectric layer IN. The drain electrode D contacts the other side of the semiconductor layer A through a drain contact hole penetrating the interlayer dielectric layer IN.

Each of the source electrode S and the drain electrode D may be formed as a single layer or as a multilayer. When each of the source electrode S and the drain electrode D is formed as the single layer, each of the source electrode S and the drain electrode D may be formed of molybdenum (Mo), aluminum (Al), chrome (Cr), gold (Au), titanium (Ti), nickel (Ni), neodymium (Nd), copper (Cu), or a combination thereof. When each of the source electrode S and the drain electrode D is formed as the multilayer, each of the source electrode S and the drain electrode D may be formed as a double layer of Mo/Al—Nd, Mo/Al, Ti/Al or Cu/MoTi, or as a triple layer of Mo/Al-Nd/Mo, Mo/Al/Mo, Ti/Al/Ti or MoTi/Cu/MoTi.

A passivation layer PAS is positioned on the thin film transistor T. The passivation layer PAS can protect the thin film transistor T and may be formed of silicon oxide (SiOx), silicon nitride (SiNx), or a multilayer thereof.

A planarization layer OC is positioned on the passivation layer PAS. The planarization layer OC can reduce or planarize a height difference (or a step coverage) of an underlying structure and may be formed of an organic material such as photo acryl, polyimide, benzocyclobutene-based resin, and acrylate-based resin. If necessary or desired, one of the passivation layer PAS and the planarization layer OC may be omitted.

The organic light emitting diode OLE is positioned on the planarization layer OC. The organic light emitting diode OLE includes a first electrode E1 and a second electrode E2 that are positioned opposite each other, and an organic compound layer OL between the first electrode E1 and the second electrode E2. The first electrode E1 may be an anode, and the second electrode E2 may be a cathode.

More specifically, the first electrode E1 is positioned on the planarization layer OC. The first electrode E1 is connected to the drain electrode D of the thin film transistor T through a contact hole penetrating the passivation layer PAS and the planarization layer OC. The first electrode E1 may include a reflective layer and thus serve as a reflective electrode. The reflective layer may be formed of aluminum (Al), palladium (Pd), copper (Cu), silver (Ag), nickel (Ni), or a combination thereof. For example, the reflective layer may be formed of Ag/Pd/Cu (APC) alloy. The first electrode E1 may be formed as a multilayer including a reflective layer. For example, the first electrode E1 may be formed as a triple layer formed of ITO (indium tin oxide)/APC/ITO. In this instance, the lower ITO layer of the first electrode E1 may be formed for the purpose of improving adhesive characteristics between the planarization layer OC and the APC layer.

A bank BN is positioned on the substrate SUB on which the first electrode E1 is formed, and partitions adjacent pixels. The bank BN may be formed of an organic material such as polyimide, benzocyclobutene-based resin, and acrylate. A center portion of the first electrode E1 exposed by the bank BN may be defined as an emission region. The bank BN may be configured to expose the center portion of the first electrode E1 and cover an edge of the first electrode E1.

The organic compound layer OL is positioned on the first electrode E1. The organic compound layer OL may be dividedly disposed corresponding to each subpixel, or may be entirely formed on a front surface of the substrate SUB. The organic compound layer OL is a layer, in which electrons and holes combine and emit light. The organic compound layer OL includes an emission layer EML and may further include one or more of a hole injection layer HIL, a hole transport layer HTL, an electron transport layer ETL, and an electron injection layer EIL.

The second electrode E2 is positioned on the organic compound layer OL. The second electrode E2 may be entirely formed on the front surface of the substrate SUB to cover pixels. The second electrode E2 may be formed of a transparent conductive material such as indium tin oxide (ITO) and indium zinc oxide (IZO). Alternatively, the second electrode E2 may be formed of a material, which is thin enough to transmit light, for example, magnesium (Mg), calcium (Ca), aluminum (Al), silver (Ag), or a combination thereof. The second electrode E2 may serve as a transmissive electrode.

Light generated inside the organic compound layer OL is radiated in various directions. In order to increase emission efficiency of the organic light emitting diode OLED, a travel direction of radiated light needs to be controlled in a previously set direction (hereinafter referred to as "orientation direction"). Namely, a transmissive electrode and a reflective electrode may be disposed opposite each other with the organic compound layer OL interposed therebetween, in order to control the travel direction of radiated light. In aspects disclosed herein, the first electrode E1 may serve as the reflective electrode, and the second electrode E2 may serve as the transmissive electrode. Partial light travelling in the orientation direction among generated light passes through the transmissive electrode and is emitted to the outside of a display device. After a travel direction of other portion of the generated light is changed to the orientation direction by the reflective electrode, the other portion of light passes through the transmissive electrode and is emitted to the outside of the display device. When the reflective electrode is added as described above, a travel direction of light that first travels in directions other than the orientation direction can be changed to the orientation direction. Hence, light efficiency can be improved.

However, a portion of light incident on the reflective electrode is not reflected in the orientation direction by the reflective electrode and may be trapped in the element and lost. The light trapped in the element does not contribute to the emission and thus is a large factor of a reduction in the emission efficiency.

More specifically, referring to FIG. 5, a reflective electrode RE includes a reflective layer 102 and a first transparent conductive layer 101 and a second transparent conductive layer 103 that are positioned opposite each other with the reflective layer 102 interposed therebetween. A portion IL of light generated in an organic compound layer travels toward the reflective electrode RE. A portion RL of light incident on the reflective electrode RE is reflected by the reflective layer 102, and a travel direction of the light RL may be changed to the orientation direction. Other portion TL of the light incident on the reflective electrode RE may be absorbed in the reflective layer 102 as surface plasmon, or may be confined (or be trapped) in the surface of the reflective layer 102, may propagate along the flat surface of the reflective layer 102 in a confined state, and may be lost. The surface plasmon is a surface electromagnetic wave that is generated at an interface between a metal film and a non-metal film and propagates along the interface. The surface plasmon is known to be due to the collective oscillation (the charge density oscillation) of electrons generated in the surface of the metal film when a specific wavelength of light incident on the metal film and a wavelength of free electrons inside the metal film are in phase with each other. Due to the surface plasmon, the other portion TL of the light generated in the organic compound layer is confined in the element, and thus emission efficiency may be greatly reduced. Thus, there is a need for a method for effectively extracting light.

Referring to FIG. 6A, an OLED display according to an aspect of the disclosure includes a first electrode E1, a second electrode, and an organic compound layer between the first electrode E1 and the second electrode. The first electrode E1 is a reflective electrode, and the second electrode is a transmissive electrode. The first electrode E1 may be an anode, and the second electrode may be a cathode. However, aspects are not limited thereto.

The first electrode E1 includes a first transparent conductive layer 201 and a second transparent conductive layer 203 that are positioned opposite each other, and a reflective layer 202 between the first transparent conductive layer 201 and the second transparent conductive layer 203. The reflective layer 202 may include a plurality of grains GR. The first transparent conductive layer 201 and the second transparent conductive layer 203 include a non-metallic material. For example, the first transparent conductive layer 201 and the second transparent conductive layer 203 may be formed of a transparent conductive material such as indium tin oxide (ITO).

The grains GR include a metal material. The grains GR include a reflective material and function as the reflective layer 202. The reflective material may include aluminum (Al), palladium (Pd), copper (Cu), silver (Ag), nickel (Ni), or an alloy thereof. For example, the reflective material may be silver (Ag) or Ag/Pd/Cu (APC) alloy.

The grains GR may be distributed between the first transparent conductive layer 201 and the second transparent conductive layer 203 in an area corresponding to the first transparent conductive layer 201 and the second transparent conductive layer 203. At least one of the grains GR may have a different shape from other grains. Further, at least one of the grains GR may have a different width and/or height from other grains. The adjacent grains GR may be spaced from each other in at least one area, and a separation distance between the grains GR may vary depending on a position.

For example, as shown in FIG. 6B, a first grain GR1, a second grain GR2, and a third grain GR3 which are adjacent may be positioned to be spaced from one another. A separation distance D1 between the adjacent first and second grains GR1 and GR2 may be different from a separation distance D2 between the adjacent second and third grains GR2 and GR3. As another example, as shown in FIG. 6C, when it is assumed that there are a first segment L1 connecting the first grain GR1 and the second grain GR2, a second segment L2 connecting the second grain GR2 and the third grain GR3, and a third segment L3 connecting the third grain GR3 and the first grain GR1, at least one of a first angle θ1 formed by the first segment L1 and the second segment L2, a second angle θ2 formed by the second segment L2 and the third segment L3, and a third angle θ3 formed by the third segment L3 and the first segment L1 may be different from the other angle.

In the aspect of the disclosure, because the reflective layer 202 is composed of the grains GR including the reflective material, the reflective layer 202 constituting the first electrode E1 may have an uneven surface unlike a related art. The grains GR can function to scatter light, which did not contribute to the light extraction due to the surface plasmon, and extract the light to the outside. In other words, the aspect of the disclosure forms the reflective layer 202 using the grains GR and thus can induce light provided by the organic compound layer to be extracted without being trapped.

The second transparent conductive layer 203 on the reflective layer 202 is formed along interfaces of the grains GR and has a curved lower surface. The curve formed at the lower surface of the second transparent conductive layer 203 can function to scatter light, which did not contribute to the light extraction due to the surface plasmon, and extract the light to the outside. In other words, the aspect of the disclosure forms the reflective layer 202 using the curved lower surface of the second transparent conductive layer 203 and thus can induce light provided from the organic compound layer to be extracted without being trapped. A structure according to the aspect of the disclosure may be more effective in a top emission OLED display.

Hereinafter, an outcoupling effect of the reflective electrode according to the aspect of the disclosure is described through a comparative example and an experimental example. An experimental example described below is merely an example of aspects of the disclosure, and thus aspects are not limited to the following experimental example. FIGS. 7A and 7B illustrate results of a comparative example and an experimental example, and the results are used to confirm whether or not an outcoupling efficiency is improved.

A reflective electrode according to a comparative example includes a reflective layer (e.g., including APC alloy) having a flat surface. A reflective electrode according to an experimental example includes a reflective layer (e.g., including APC alloy) having an uneven surface including grains. In both the reflective electrode according to the comparative example and the reflective electrode according to the experimental example, the reflective layer was formed by applying APC alloy with a thickness of 50 Å. In the experimental example unlike the comparative example, a thermal process was additionally performed to form the reflective layer in the form of grains. In other words, process conditions for forming the reflective electrode in the experimental example were substantially the same as those in the comparative example, except the thermal process was added.

According to an experiment, light efficiency in the experimental example was further improved compared to light efficiency in the comparative example. Further, color coordinates in the experimental example were not greatly distorted compared to color coordinates in the comparative example. Hence, the experimental example can satisfy the color coordinates corresponding to a target while improving the light efficiency.

Referring to FIGS. 7A and 7B illustrating measurement results of the comparative example and the experimental example, an outcoupling efficiency was efficiently improved in a visible wavelength band as shown in FIG. 7A. Further, as shown in FIG. 7B, a light efficiency was improved in a full range of a viewing angle.

Figure 8A:
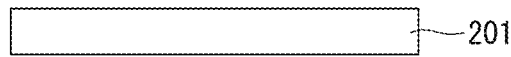
FIGS. 8A to 8D illustrate in stages a method of manufacturing a first electrode according to an aspect of the disclosure.
Figure 8B:
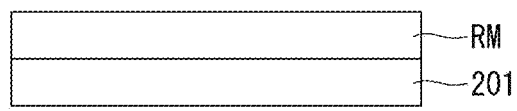
Figure 8C:
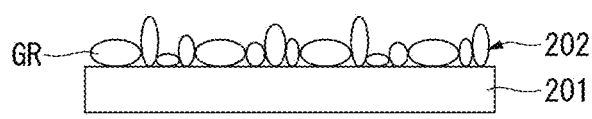
Figure 8D:
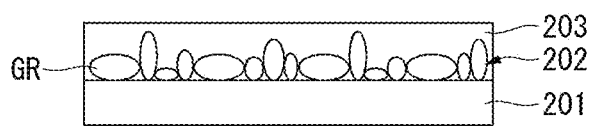
Figure 9:
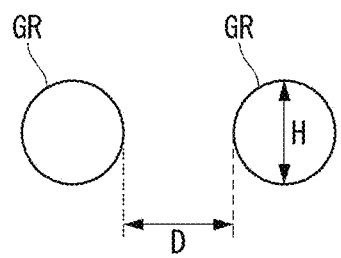
FIGS. 9 and 10 illustrate an effect according to an aspect of the disclosure.
Figure 10:
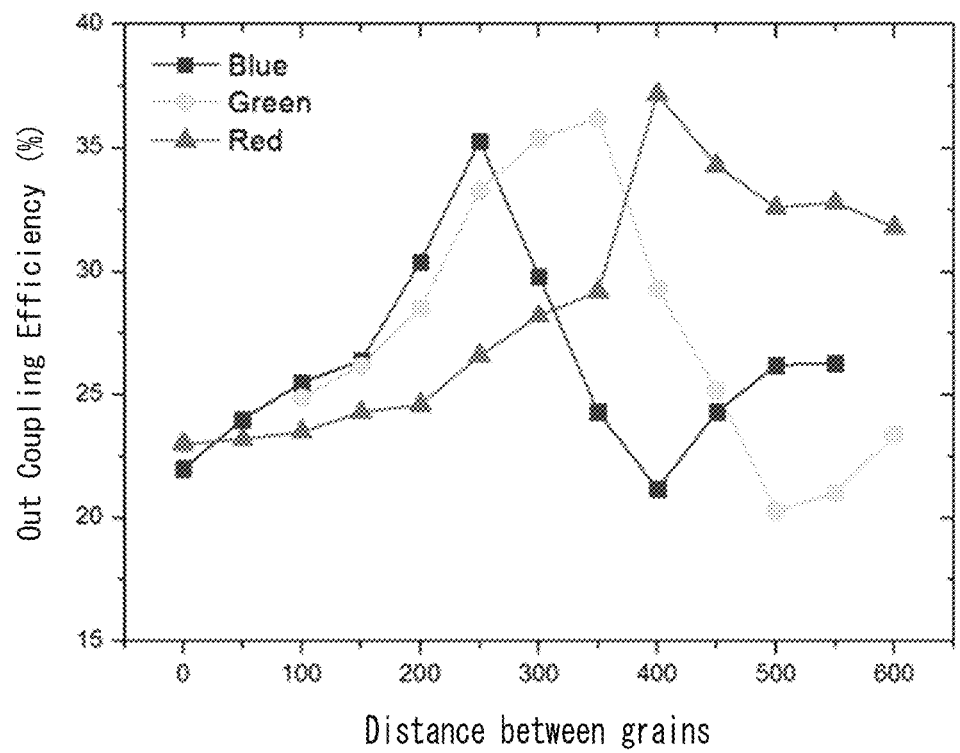

With reference to FIGS. 8A to 8D and FIGS. 9 and 10, a method of manufacturing a first electrode according to an aspect of the disclosure is described below. FIGS. 8A to 8D illustrate in stages a method of manufacturing a first electrode according to an aspect of the disclosure. FIGS. 9 and 10 illustrate an effect according to an aspect of the disclosure. Aspects of the disclosure describe the method of manufacturing the first electrode through a plurality of steps, but the steps are merely provided for convenience of explanation. For example, the steps may be subdivided.

As shown in FIG. 8A, a transparent conductive material is applied to form a first transparent conductive layer 201. The transparent conductive material may be indium tin oxide (ITO). The first transparent conductive layer 201 may be disposed on a planarization layer OC (shown in FIG. 4) covering a thin film transistor T (see FIG. 4) and may directly contact the thin film transistor T through a contact hole penetrating the planarization layer OC.

As shown in FIGS. 8B and 8C, a reflective conductive material RM is applied to the first transparent conductive layer 201 and is thermally processed to form a reflective layer 202. The reflective conductive material RM may be Ag/Pd/Cu (APC) alloy. The reflective conductive material RM is thermally processed and remains on the first transparent conductive layer 201 in the form of grains GR. Namely, the reflective layer 202 is configured such that the plurality of grains GR is distributed on the first transparent conductive layer 201. Thus, an upper surface of the reflective layer 202 has a predetermined roughness. Aspects of the disclosure include the reflective layer 202 having an uneven surface on the first transparent conductive layer 201 and thus can easily extract light, which may propagate along a flat surface due to surface plasmon and may be lost, in an orientation direction.

Aspects of the disclosure do not require an additional process such as a mask process for forming a separate pattern used to extract light. Because the mask process including complicated steps does not need to be performed, aspects of the disclosure can remarkably reduce process defects and considerably improve the yield.

Further, because a size of pixels relatively decreases in high resolution display devices having a high pixel per inch (PPI), a size of a first electrode E1 included in each pixel may also decrease. In this instance, there is a limitation in finely forming a light extraction pattern using a simple pattern process. Aspects of the disclosure can form the grains GR for the light extraction through only the thermal processing and thus can easily form a fine pattern which cannot be formed through another process such as the mask process.

The thermal process for forming the grains GR constituting the reflective layer 202 may be performed at a temperature equal to or higher than 200° C. However, aspects are not limited thereto. In order to form the grains GR through the thermal processing of the reflective conductive material RM, process conditions such as a process time and a process material may be properly selected.

Referring to FIG. 9, adjacent grains GR may be spaced from each other by a predetermined distance D. This indicates that voids may be formed in a portion of the reflective layer 202 as the grains GR are distributed on the first transparent conductive layer 201 in the form of fine particles. As the adjacent grains GR do not contact each other and are spaced from each other by the predetermined distance D, it is possible to increase a surface area of an interface capable of scattering light, which is not reflected from the surface of the reflective layer 202 and is trapped in the surface of the reflective layer 202. Hence, aspects of the disclosure can form the element having improved light extraction efficiency.

The distance D between the adjacent grains GR may be 150 Å to 600 Å. Referring to FIG. 10, when the distance D between the grains GR was 150 Å to 600 Å, the outcoupling efficiency was improved.

When the distance D between the adjacent grains GR exceeds 600 Å, a large void may be formed at a specific position. Hence, a second transparent conductive layer 203 to be formed subsequently may be non-uniformly formed due to the large void. In other words, the second transparent conductive layer 203 on the reflective layer 202 does not have a flat upper surface and may have a stepped portion (or a height difference) due to the void. In this instance, the organic compound layer to be formed subsequently may be thin formed at the specific position due to the stepped portion of the second transparent conductive layer 203. Further, a current may be concentrated in a portion of the organic compound layer which is thin formed, and thus the first electrode E1 and the second electrode, which are positioned opposite each other with the organic compound layer interposed therebetween, may have a defect of a short circuit. Thus, the distance D between the adjacent grains GR may be set to be equal to or less than 600 Å.

Aspects of the disclosure may differently set a range of the distance D between the grains GR in each pixel. Namely, the pixels may include first and second pixels each emitting light of a different color. Further, a range of a distance D between grains GR of a reflective electrode included in the first pixel may be set to be different from a range of a distance D between grains GR of a reflective electrode included in the second pixel.

For example, a distance D between grains GR included in a red pixel may have an average value within a range of 350 Å to 550 Å, alternatively within a range of 380 Å to 450 Å. A distance D between grains GR included in a green pixel may have an average value within a range of 200 Å to 400 Å, alternatively within a range of 280 Å to 380 Å. A distance D between grains GR included in a blue pixel may have an average value within a range of 150 Å to 350 Å, alternatively within a range of 230 Å to 280 Å.

The distance D between the grains GR may be controlled by a thickness of the reflective conductive material RM applied to the first transparent conductive layer 201 before the thermal processing. More specifically, when the reflective conductive material RM is applied with a predetermined thickness or more, aggregation of the reflective conductive material RM may occur, and a plurality of large voids may be formed in the reflective layer 202 after the thermal processing. As described above, the large voids may lead to a short circuit between the first electrode E1 and the second electrode. Therefore, the thickness of the reflective conductive material RM applied to the first transparent conductive layer 201 may be selected from a range of 50 Å to 200 Å.

The thickness of the reflective conductive material RM before the thermal processing determines a height H of the grains GR after the thermal processing. Thus, as described above, the height H of the grain GR may be selected from a range of 50 Å to 200 Å in order to prevent the formation of the large void.

As shown in FIG. 8D, a transparent conductive material is applied to a substrate, on which the reflective layer 202 is formed, to form the second transparent conductive layer 203. The transparent conductive material may be indium tin oxide (ITO).

As described above, the aspects of the disclosure can induce light provided by the organic compound layer to be easily extracted without being trapped using the reflective electrode including the grains. Hence, the aspects of the disclosure can provide a reflective electrode having a greatly improved light outcoupling efficiency and an OLED display including the reflective electrode. The aspects of the disclosure can form the grains for the light extraction through only the thermal processing and thus can easily form a fine pattern which cannot be formed through another process such as the mask process.

Although the aspects have been described with reference to a number of illustrative aspects thereof, numerous other modifications and aspects may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A reflective electrode comprising:
   a first transparent conductive layer formed of a first transparent conductive material;
   a reflective layer disposed on the first transparent conductive layer and including a plurality of grains formed of a reflective conductive material; and
   a second transparent conductive layer disposed on the reflective layer and formed of a second transparent conductive material,
   wherein adjacent grains are spaced from each other on at least one area,
   wherein the first transparent conductive layer and the second transparent conductive layer are in contact with each other on the at least one area, and
   wherein a first distance between a first grain and a second grain adjacent to the first grain and a second distance between the second grain and a third grain adjacent to the second grain are different.

2. The reflective electrode of claim 1, wherein the adjacent grains are separated from each other in a range of 150 Å to 600 Å.

3. The reflective electrode of claim 1, wherein the plurality of grains has a height in a range of 50 Å to 200 Å.

4. An organic light emitting diode display comprising:
   a display panel including a plurality of pixels, each pixel including a transistor and an organic light emitting diode connected to the transistor,
   wherein the organic light emitting diode includes a reflective electrode,
   wherein the reflective electrode includes:
   a first transparent conductive layer formed of a first transparent conductive material;

a reflective layer disposed on the first transparent conductive layer and including a plurality of grains formed of a reflective material; and a second transparent conductive layer disposed on the reflective layer and formed of a second transparent conductive material, wherein the plurality of pixels includes first and second pixels each emitting light of different color, wherein a range of a distance between adjacent grains among the plurality of grains of a reflective electrode included in the first pixel is different from a range of a distance between adjacent grains among the plurality of grains of a reflective electrode included in the second pixel.

5. The organic light emitting diode display of claim 4, wherein the plurality of pixels includes a first pixel emitting red light, a second pixel emitting green light, and a third pixel emitting blue light, wherein a distance between adjacent grains of a reflective electrode included in the first pixel has an average value in a range of 380 Å to 450 Å, wherein a distance between adjacent grains of a reflective electrode included in the second pixel has an average value in a range of 280 Å to 380 Å, wherein a distance between adjacent grains of a reflective electrode included in the third pixel has an average value in a range of 230 Å to 280 Å.

6. A method of manufacturing a reflective electrode comprising:

forming a first transparent conductive layer formed of a first transparent conductive material;

applying a reflective conductive material to the first transparent conductive layer to cover the first transparent conductive layer and thermally processing the reflective conductive material to form a reflective layer including a plurality of grains; and forming a second transparent conductive layer formed of a second transparent conductive material on the reflective layer, and wherein adjacent grains are spaced from each other on at least one area, and wherein a first distance between a first grain and a second grain adjacent to the first grain and a second distance between the second grain and a third grain adjacent to the second grain are different.

7. The method of claim 6, wherein the first and second distances are determined based on a thickness of the reflective conductive material applied to the first transparent conductive layer.

8. The method of claim 7, wherein the thickness of the reflective conductive material applied to the first transparent conductive layer is in a range of 50 Å to 200 Å.

9. A reflective electrode of an organic light emitting diode display, comprising:

a first transparent conductive layer;

a reflective layer disposed on the first transparent conductive layer and having an irregular top surface to enhance light out-coupling efficiency of the organic light emitting diode display; and a second transparent conductive layer disposed on the reflective layer and having a bottom surface matching a contour of the top surface of the reflective layer, wherein the reflective layer includes a plurality of grains, wherein adjacent grains are spaced from each other on at least one area, and wherein the first transparent conductive layer and the second transparent conductive layer are in contact with each other on the at least one area, and wherein a first distance between a first grain and a second grain adjacent to the first grain and a second distance between the second grain and a third grain adjacent to the second grain are different.

10. The reflective electrode of claim 9, wherein the adjacent grains are separated from each other in a range of 150 Å to 600 Å.

11. The reflective electrode of claim 9, wherein the plurality of grains has a height in a range of 50 Å to 200 Å.

12. The reflective electrode of claim 9, wherein the reflective layer is formed of aluminum (Al), palladium (Pd), copper (Cu), silver (Ag), nickel (Ni), or an alloy thereof.

13. The reflective electrode of claim 9, wherein the reflective layer is formed of an Ag/Pd/Cu (APC) alloy.

* * * * *